Sept. 29, 1964 W. M. HENNESSEY 3,151,210

PACKAGE FOR ELECTRONIC APPARATUS

Filed Oct. 12, 1960

INVENTOR.
WILLIAM M. HENNESSEY
BY Robert A. Green
ATTORNEY

United States Patent Office 3,151,210

Patented Sept. 29, 1964

3,151,210

PACKAGE FOR ELECTRONIC APPARATUS

William M. Hennessey, Roslyn, Pa., assignor to Burroughs Corporation, Detroit, Mich., a corporation of Michigan Filed Oct. 12, 1960, Ser. No. 62,142
2 Claims. (Cl. 174—59)

This invention relates to the art of packaging and, particularly, to the art of packaging electrical components for use in printed circuit assemblies and the like.

One type of package contemplated by the present invention comprises a container of synthetic resinous material within which an electronic component is carried. The component includes electrodes which are to be connected to suitable circuit connections outside of the enclosing container, and, in general, the container is provided with terminals to which the component leads are coupled and from which connections are made to other external circuit elements such as a printed circuit board. The primary problem which arises concerns the terminals carried by the container and their location. The terminals may extend from the bottom of the container, in which position they may be soldered to a printed circuit board. However, in this arrangement, solder joints are difficult to make and inspect, and the removal of such a package for servicing or replacement is difficult and expensive. In another arrangement, the terminals may extend through the top of the component container. However, in this arrangement, excessive vertical space is required, and the stacking of printed circuit boards side by side is complicated by the danger of shorts between the top-mounted terminals of a component on one board and components on an adjacent board.

In the optimum arrangement, the terminals extend from the sides of the component container. Several arrangements of containers having side terminals are known. However, all of these are generally undesirable or unsatisfactory because of problems which arise in making connections thereto and in securing the terminals in the container itself.

Accordingly, the purposes and objects of the present invention are concerned with the provision of an improved miniaturized package for electronic components for use with printed circuit boards and the like.

Briefly, according to the invention, a container is provided which is preferably made of synthetic resinous material having its upper edge provided with thin, fragile, web-like wall portions. These wall portions define slots which are provided in the side wall of the container. When the component to be secured within the package is selected and the number of its leads is determined, the corresponding number of web-like wall portions is removed to provide slots or channels in which metallic terminal elements may be seated and which extend laterally through the side wall or walls of the container. Leads from the component to be packaged are secured to internal portions of the terminal members, and similar wire leads are secured from external portions of the terminal members to terminals on a printed circuit board or the like. The package is then filled with a suitable potting material which embeds the electrical component and fills the other slots which still retain their webs. A cover member is provided to complete the container.

The invention is described in greater detail by reference to the drawing wherein.

Figure 1:
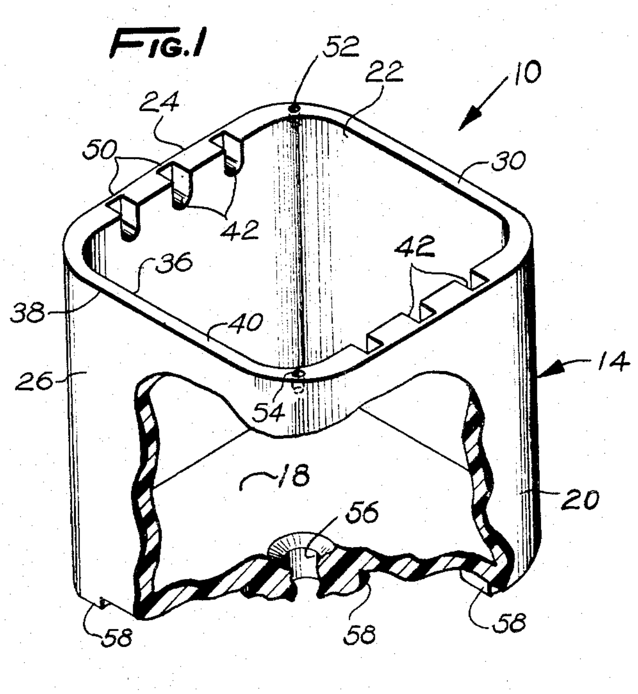
FIG. 1 is a perspecitve view, partly in section, of apparatus embodying the invention.
Figure 2:
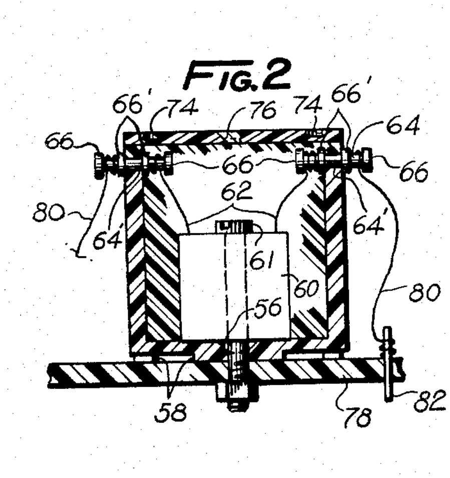
FIG. 2 is a sectional view of a package embodying the invention and mounted on a support base.
Figure 3:
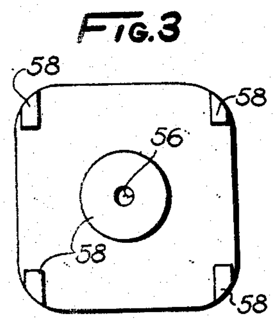
FIG. 3 is a bottom plan view of the package of FIG. 2.
Figure 4:
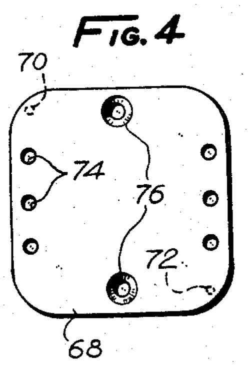
FIG. 4 is a top plan view of the cover of the package of FIG. 2.
Figure 5:
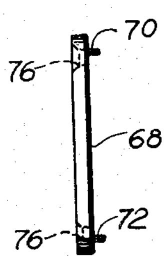
FIG. 5 is a side view of the cover shown in FIG. 4.

Referring to the drawings, a package 10 for electrical components embodying the invention includes a cup-like container 14 of a suitable synthetic resinous material such as diallyl-phthalate or the like. The container 14 may be formed by a molding operation and includes a base 18 and a side wall 20 having an open upper end 22. The side wall has an inner surface 36, an outer surface 38, and a top surface 40. The top surface of the side wall 20 includes a plurality of spaced-apart slots or depressions 42 which may be spaced and grouped in any suitable manner. In the illustrated embodiment of the invention, they are formed in opposed portions of the side wall. The slots 42 extend outwardly from the inner surface 36 of wall 20 to near to the outer surface 38 from which they are separated by a thin web or wall portion 50. The webs 50 are coextensive with the outer surface of the side wall of the container and extend upwardly to the top surface 40. The top surface 40 is also provided with at least two spaced-apart holes 52 and 54 for use in orienting a cover plate for the container.

The base 18 of the container is provided with an aperture 56, by means of which an electrical component may be secured within the container and by means of which the container may be bolted or otherwise secured to a base support member such as a printed circuit board. In addition, the outer surface of the base is provided with a plurality of raised portions or pads 58 on which the container rests and which raise the container above the surface of the support member to allow wires or the like to pass under it. Any number of suitably positioned pads may be provided.

In packaging an electrical component 60 within the container 14, the component is held within the container in any suitable manner, for example, by means of a bolt 61 which extends through the component and through the hole 56 in the base 18 of the container. Assuming that the component has leads 62, each of which is to be connected to a side terminal member 64, then the positions for the terminals are selected, and the thin web 50 associated with the slot in which the terminal is to be mounted is removed in any suitable manner. The webs may be removed by forcing the terminals into the selected slots. After the selected webs have been removed, the terminal members 64 are seated in the slots or channels which now extend through the side wall of the container.

For ease of mounting, the terminal members 64 comprise elongated metallic bodies having a plurality of spaced apart lips or flanges 66. Two of the flanges 66′ are positioned to engage the inner and outer surfaces 36 and 38 of wall 20 and thus secure the terminals in position in a slot, and a portion 64′ of the terminal lies in the slot. In order to prevent leakage through the slots of potting material which is provided within the container 14 during the packaging operation, the portions 64′ of the terminals are designed to fill as much of the slot as possible and the flanges 66′ are also designed to cover as much of the cross-sectional area of the slot as possible. The leads 62 are wound around portions of the terminals 64 which lie inside the container 14 and are soldered thereto.

A cover member 68, provided for the container 14, comprises a thin plate which may be of the same material as the container and of a size and shape suitable to completely cover the container and to rest on the top surface 20 thereof. The cover member 68 is provided with positioning studs 70 and 72 which are adapted to enter the holes 52 and 54 and thereby align the cover on the container. In addition, the cover is provided with depressions 74 which are positioned one over each slot 42 when the cover is in position on the container. These depressions may be used to provide identifying color markings or the like so that the component and its leads may be identified as required. The cover is also provided with a plurality of chamfered filler holes 76, by means of which potting material may be introduced into the container.

In assembling the package of the invention, after the leads 62 have been secured to the terminals 64 inside the container 14, the container may be filled with a suitable potting material such as an epoxy resin. Preferably, the container is filled to about the level of the terminals 64, and then the cover 68 is placed in position. Potting material is then introduced into the container through the holes 76 in a quantity sufficient to fill the container, the unused slots 42, and the holes 76. The potting material also fills the holes 76 and thus serves to secure the cover in position. The potting material may also fill the channels 42 without leaking out of the container.

In using the package of the invention, it is secured, for example, to a printed circuit board 78 or the like by means of the bolt 61, and the side terminals 64 are electrically connected by leads 80 to appropriate terminals or pins 82 in the board 78. The leads 80 may be soldered to the terminals 64 and 82. The desired electrical connection is thus easily made. If it is desired to remove the package from the board 78, removal is similarly easily accomplished by merely cutting the leads and releasing the bolt 61. It can be seen that mounting and dismounting operations may be accomplished without adversely affecting the component 60 and its leads and the side terminals 64.

Some of the advantages of the present invention are as follows. A variable and controlled number of side terminals may be provided for the package in simple and inexpensive fashion. Connections may be easily made between the contained component and the package terminals and between the terminals and external circuit elements. If the package becomes defective and must be removed, the external leads are easily broken without adversely affecting the printed circuit board or the other adjacent components.

What is claimed is:

1. A package for electronic apparatus comprising a container having an open end and a top surface defining said open end, said container including a side wall having an inner surface and an outer surface, and a plurality of slots in said top surface, said slots extending outwardly from said inner surface of said container to near to said outer surface of said container, said slots each terminating in a thin wall which is coextensive with said outer surface of said container, each of said thin walls being adapted to be removed to provide channels extending completely through said side wall of said container, selected ones of said slots extending completely through said side wall and providing communication between the inside and outside of said container, a conductive terminal member seated in each of said selected slots and including a first portion which lies inside said container and a second portion which lies outside said container, said terminal member including a pair of spaced-apart flanges which engage the inner and outer walls of said container and thereby hold said terminal member in position, said flanges having a cross-sectional area great enough to overlie the cross-sectional area of the channel in which it lies so that any fluid potting material present inside the container is prevented by said flanges from flowing out of the container through the channel, an electronic component seated in said container and having leads each secured to the first portion of one of said terminal members, said second portion outside said container being available for connection to another electronic component, a cover member secured to said container and closing the open end thereof, and a potting material filling said container and filling said slots and channels.

2. A package for electronic apparatus comprising a container having an open end and a top surface defining said open end, said container including a side wall having an inner surface and an outer surface, and a plurality of slots in said top surface, said slots extending outwardly from said inner surface of said container to near to said outer surface of said container, said slots each terminating in a thin wall which is coextensive with said outer surface of said container, each of said thin walls being adapted to be removed to provide channels extending completely through said side wall of said container, selected ones of said slots extending completely through said side wall and providing communication between the inside and outside of said container, a conductive terminal member seated in each of said selected slots and including a first portion which lies inside said container and a second portion which lies outside said container, said terminal member including a pair of spaced-apart flanges which engage the inner and outer walls of said container and thereby hold said terminal member in position, said flanges having a cross-sectional area great enough to overlie the cross-sectional area of the channel in which it lies so that any fluid potting material present inside the container is prevented by said flanges from flowing out of the container through the channel, an electronic component seated in said container and having leads each secured to the first portion of one of said terminal members, said second portion outside said container being available for connection to another electronic component, and a cover member secured to said container and closing the open end thereof, said cover member having a pair of holes for introducing potting material into said container, the potting material filling said container and said holes and thereby securing said cover to said container.

References Cited in the file of this patent

UNITED STATES PATENTS

| | | |
|---|---|---|
| Re. 18,627 | Kleckner | Oct. 18, 1932 |
| 2,063,099 | Loock | Dec. 8, 1936 |
| 2,329,442 | Popp | Sept. 14, 1943 |
| 2,354,159 | Venable | July 18, 1944 |
| 2,779,813 | Collins | Jan. 29, 1957 |
| 2,864,057 | Connelly et al. | Dec. 9, 1958 |